(12) United States Patent
Alers et al.

(10) Patent No.: US 6,403,415 B1
(45) Date of Patent: Jun. 11, 2002

(54) SEMICONDUCTOR DEVICE HAVING A METAL BARRIER LAYER FOR A DIELECTRIC MATERIAL HAVING A HIGH DIELECTRIC CONSTANT AND A METHOD OF MANUFACTURE THEREOF

(75) Inventors: Glenn B. Alers, Chatham, NJ (US); Sailesh M. Merchant; Pradip K. Roy, both of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/481,463

(22) Filed: Jan. 11, 2000

Related U.S. Application Data
(60) Provisional application No. 60/115,842, filed on Jan. 13, 1999.

(51) Int. Cl.$^7$ .......................................... H01L 21/8242
(52) U.S. Cl. ...................................... 438/240; 438/296
(58) Field of Search ................................ 438/240, 396, 438/591; 257/300, FOR 177, FOR 220

(56) References Cited

U.S. PATENT DOCUMENTS

| | | | |
|---|---|---|---|
| 5,858,843 A | * | 1/1999 | Doyle et al. |
| 6,100,120 A | * | 8/2000 | Yu |
| 6,100,204 A | * | 8/2000 | Gardner et al. |
| 6,133,106 A | * | 10/2000 | Evans et al. |
| 6,146,937 A | * | 11/2000 | Hong |
| 6,153,466 A | * | 11/2000 | Yew et al. |
| 6,187,624 B1 | * | 2/2001 | Huang |
| 6,190,963 B1 | * | 2/2001 | Zhang et al. |
| 6,194,748 B1 | * | 2/2001 | Yu |
| 6,197,668 B1 | * | 3/2001 | Gardner et al. |
| 6,200,866 B1 | * | 3/2001 | Ma et al. |
| 6,207,985 B1 | * | 3/2001 | Walker |

OTHER PUBLICATIONS

Chatterjee et al., CMOS Metal Replacement Gate Transistors using Tantalum Pentoxide Gate Insulator, IEEE 1998, 0–7803–4774.*

Miki et al., Leakage–Current mechanism of a tantalum–pentoxide capacitor on rugged Si with a CVD–Tin plat electrode for high–density DRAMs, 1999 Symposium on VLSI Technology Digest of Technical Papers.*

Chen et al., A Study of Rapid Photothermal Annealing on the Electricla Properties and Reliability on Tantalum Pentoxide, IEEE 1999, 0018–9383.*

Jiang et al., Tantalum Oxide thin film for Microelectronic Application, Rochester Institute of Technology.*

* cited by examiner

Primary Examiner—Long Pham
Assistant Examiner—Thanh V Pham

(57) ABSTRACT

The present invention provides a semiconductor device that has a metal barrier layer for a dielectric material, which can be used in an integrated circuit, if so desired. The semiconductor device provides a capacitance to the integrated circuit and in a preferred embodiment comprises a first layer located on a surface of the integrated circuit. A metal barrier layer is located on the first layer and is susceptible to oxidation by oxygen. A high K capacitor dielectric layer (i.e., a higher K than silicon dioxide) that contains oxygen, such as tantalum pentoxide, is located over the metal barrier layer. The semiconductor device further includes a first layer located over the high K capacitor dielectric layer.

13 Claims, 2 Drawing Sheets

SEMICONDUCTOR DEVICE HAVING A METAL BARRIER LAYER FOR A DIELECTRIC MATERIAL HAVING A HIGH DIELECTRIC CONSTANT AND A METHOD OF MANUFACTURE THEREOF

CROSS-REFERENCE TO PROVISIONAL APPLICATION

This application claims the benefit of U.S. Provisional Application No. 60/115,842 entitled "ALUMINUM BARRIER LAYER FOR HIGH-IC DIELECTRIC IN CAPACITORS/GATE APPLICATION," to Alers, et. al., filed on Jan. 13, 1999, which is commonly assigned with the present invention and incorporated herein by reference as if reproduced herein in its entirety.

TECHNICAL FIELD OF THE INVENTION

The present invention is directed, in general, to a semiconductor device that includes a dielectric material that has a high dielectric constant (K) and a metal barrier layer for that dielectric material, and, more specifically, to a semiconductor device having a capacitor or gate with a high K dielectric material incorporated within the capacitor or gate and a metal barrier layer for that dielectric material.

BACKGROUND OF THE INVENTION

As device dimensions within semiconductor devices, such as capacitors or gates within integrated circuits (ICs), continue to shrink to accommodate increased packing density, the dimensions of the various components within these semiconductor devices must shrink proportionally for proper operation of the IC. Problems have particularly arisen with respect to the dielectric layers that form a part of capacitors and gates, such as capacitor dielectric layers and gate oxide layers.

For example, capacitor structures often found within today's IC designs have evolved to include high K dielectrics, such as tantalum pentoxide ($Ta_2O_5$). However, the use of $Ta_2O_5$ has encountered oxygen diffusion problems. In many capacitor structures, silicon nitride (SiN) is often used as a barrier layer to prevent oxygen diffusion from the capacitor electrode into surrounding silicon and to prevent silicon diffusion into the capacitor electrode. Titanium nitride (TiN) has also been used as a capacitor electrode in back-end capacitor. While TiN has worked well as an electrode, its use poses problems when used with $Ta_2O_5$. When TiN comes into direct contact with $Ta_2O_5$, the TiN "steals" oxygen from the $Ta_2O_5$. The depletion of oxygen from the $Ta_2O_5$ can lead to a decreased capacitance, which, of course is undesirable for proper capacitor operation.

Tantalum pentoxide ($Ta_2O_5$) has also found use in transistor gate structures because gate oxide thicknesses have decreased to accommodate the overall decrease in device size. Currently, a typical thickness of the gate oxide is about 2 nm. However, conventional silicon dioxide gate oxides have begun to run into functional limitations. For example, the industry has found that if the silicon dioxide thickness goes below about 2 nm, it is easily tunneled through and, thus, stops functioning as an oxide. The tunneling currents can degrade the transistor's performance, which, of course, is undesirable. Moreover, as the size decreases, it is highly desirable to keep the gate capacitance as high as possible, inasmuch as the transistor drive current is proportional to the gate capacitance. If the device size is to be scaled down further, it must be done so without reducing the transistor's drive current.

To alleviate this problem, the semiconductor industry has recently begun to use high K dielectric materials, such as $Ta_2O_5$, within the gate oxide structure. However, as is the case with capacitors, the use of $Ta_2O_5$ has also encountered problems within the gate structure. For example, $Ta_2O_5$ is also easily reduced by silicon just as it is easily reduced by TiN. In other words, the silicon with which the $Ta_2O_5$ is typically in contact, getters oxygen from the $Ta_2O_5$. Again, this is an undesirable result because, as previously mentioned, it is important to keep the gate capacitance as high as possible. If oxygen is taken away from the $Ta_2O_5$ layer, its capacitance will decrease and could possibly cause the transistor to malfunction or fail all together.

Accordingly, what is needed in the art is a semiconductor device in which a high K dielectric material can be used to maintain the desired degree of capacitance while avoiding reduction by surrounding materials. The present invention addresses this need.

SUMMARY OF THE INVENTION

To address the above-discussed deficiencies of the prior art, the present invention provides a semiconductor device that has a metal barrier layer for a dielectric material, which can be incorporated into an integrated circuit. The semiconductor device provides a capacitance to the integrated circuit. In a preferred embodiment, the semiconductor device comprises a first layer disposed over a substrate. A metal barrier layer, which is susceptible to oxidation by oxygen, is disposed over the first layer. A high K capacitor dielectric layer (i.e., a higher K than silicon dioxide) that contains oxygen, such as tantalum pentoxide, is located over the metal barrier layer. In a preferred embodiment, the high K dielectric layer may be susceptible to oxygen depletion by the first layer. Furthermore, the metal barrier layer may serve as an oxygen diffusion barrier layer between the first layer and the high K dielectric layer. The semiconductor device further includes a second layer located over the high K capacitor dielectric layer.

In one embodiment, the semiconductor device is a transistor gate located over a doped transistor tub region wherein the first layer is a portion of the doped transistor tub region. The second layer is a transistor gate that is located over the high K capacitor dielectric layer, and the high K capacitor dielectric layer is located over the doped transistor tub region and serves as a gate oxide layer for the transistor gate. The metal from which the metal layer may be formed, preferably a metal such as aluminum, can be easily oxidized. Other exemplary metals include zirconium hafnium, and yttrium. In another aspect, the gate oxide layer contains tantalum pentoxide, which has a dielectric constant that is higher than that of silicon dioxide. The gate oxide layer may have a thickness that ranges from about 2 nm to about 7 nm. Thus, in this particular embodiment, the semiconductor device is a front-end transistor structure that provides a capacitance to the integrated circuit.

In another embodiment, the semiconductor device is a capacitor, which may be formed in the back-end of the fabrication process. In one aspect, the first layer is a metallic layer, such as titanium nitride, that is located under the high K capacitor dielectric layer. In such embodiments, the capacitor may be located within an opening that is located in a dielectric layer of the integrated circuit and overlays a transistor level of the integrated circuit. As with previous embodiments, the metal barrier layer preferably contains aluminum and may have a thickness that ranges from about 0.2 nm to about 4 nm.

In another aspect, the present invention provides a method of forming an integrated circuit on a semiconductor wafer. In a preferred embodiment, the method comprises forming a doped transistor tub region within a substrate of the semiconductor wafer, forming an integrated circuit substrate over the doped transistor tub region, and forming a device within the integrated circuit for providing a capacitance to the integrated circuit. Forming the semiconductor device includes forming a first layer over a substrate and forming a metal barrier layer, such as aluminum, which is susceptible to oxidation by oxygen, on the first layer. The method further comprises forming a high K capacitor dielectric layer containing oxygen, such as tantalum pentoxide, over the metal barrier layer. In a preferred embodiment, the high K dielectric layer may be susceptible to oxygen depletion by the first layer. As such, the metal barrier layer serves as an oxygen diffusion barrier layer between the first layer and the high K dielectric layer. The method further includes forming a second layer over the high K capacitor dielectric layer.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
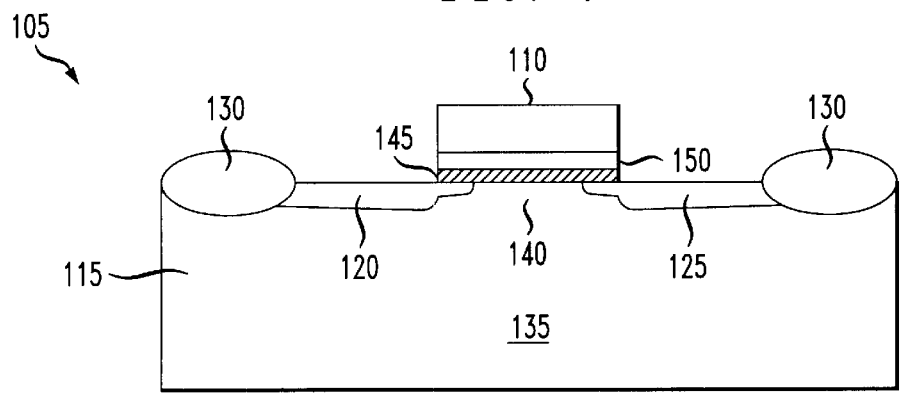
FIG. 1 illustrates a partial sectional view of one embodiment of the present invention that is directed, in general, to a device for providing a capacitance to an integrated circuit.

Referring initially to FIG. 1, there is illustrated a partial sectional view of one embodiment of the present invention. As set forth below, the present invention is directed, in general, to a device for providing a capacitance to an integrated circuit. Given the unique structure provided by the present invention, the capacitance may be provided through a front-end transistor gate structure, by a capacitor, or other device that is capable of providing an intended capacitance to the integrated circuit. FIG. 1 shows one embodiment of a device 105 as covered by the present invention. In this particular embodiment, the semiconductor device 105 is a transistor gate 110 formed on a surface of a semiconductor wafer 115. Conventional source and drain 120,125 are also shown as well as conventional field oxide regions 130. The transistor gate 110 is formed over a conventional tub region 135. Depending on the type of device, the tub region 135 may be either an n-tub or p-tub that is formed in a doped epitaxial layer (not shown). The tub region 135 is of conventional design and those who are skilled in the art are familiar with this portion of the structure. The transistor gate 110, source and drain 120,125, field oxide regions 130 and the tub region 135 form an active device of the integrated circuit. Of course, the integrated circuit typically consists of millions of such active devices that are interconnected in accordance with selected circuit designs and applications.

The semiconductor device 105 includes a first layer 140. In the embodiment illustrated in FIG. 1, the tub region 135 serves or functions as a first layer for the semiconductor device 105, while the transistor gate 110 functions as a second layer. A metal barrier layer 145, which is susceptible to oxidation by oxygen, is located on the first layer 140. In a preferred embodiment, the metal barrier layer 145 is a metal that can be easily oxidized, such as aluminum. Other exemplary metals however, include zirconium, Hafnium, and yttrium. The metal barrier layer 145 can be deposited by conventional deposition processes, such as chemical or physical vapor deposition, to any predetermined thickness. However, in an advantageous embodiment, the metal barrier layer 145 is deposited to a thickness ranging from about 0.2 nm to about 4 nm.

A high K capacitor dielectric layer 150 that contains oxygen is located on the metal barrier layer 145. As used herein, a high K capacitor material is any oxygenated dielectric material that has a dielectric constant greater than that of silicon dioxide; an example of such a material is $Ta_2O_5$. The high K dielectric layer 150 may be deposited by conventional deposition processes and thickness may vary greatly. In preferred embodiments, however, the thickness of the high K dielectric layer 150 ranges from about 2 nm to about 10 nm, and in the embodiment illustrated in FIG. 1, the thickness may range from about 2 nm to about 7 nm. While the illustrated embodiment shows the high K capacitor dielectric layer 150 located directly on the metal barrier layer 145, other embodiments may, of course, include intervening layers of materials such that the high K capacitor dielectric layer 150 is located over the metal barrier layer 145, which, in a preferred embodiment may serve as an oxygen diffusion barrier layer between the first layer 140 and the high K dielectric layer 150. In FIG. 1, the high K dielectric layer 150 also functions as the gate oxide for the transistor gate 110.

Thus, FIG. 1 shows a device 105 that provides a capacitance for an integrated circuit into which it can be incorporated. The capacitance is formed by the presences of a first electrode, which is the tub region 135 and a second electrode is the transistor gate 110. The device 105 further includes a capacitor dielectric, which is the gate oxide comprised of the high K dielectric layer 150. The metal barrier layer 145 inhibits the depletion of oxygen from the high K dielectric layer 150. All the layers that form the semiconductor device 105 can be formed by conventional semiconductor fabrication processes.

In the illustrated embodiment, the tub region 135 typically comprises silicon. Silicon can cause the oxygen within the high K dielectric layer 150 to be depleted such that it inhibits the high K dielectric layer 150 from functioning properly as a capacitor dielectric. As discussed above, this can cause the switching speed to be reduced or can cause the semiconductor device to function improperly or fail all together. This is particularly the case where the high K dielectric layer 150 is $Ta_2O_5$ where silicon readily depletes or steals oxygen from the $Ta_2O_5$. Because the metal barrier layer 145 is easily oxidized, it is believed that it traps the oxygen at the metal barrier layer 145 and high K dielectric layer 150 interface and prevents the oxygen from further being depleted from the high K dielectric layer 150. This maintains the capacitance integrity of the high K dielectric layer 150 and allows the semiconductor device 105 to provide the desired degree of capacitance.

Figure 2:
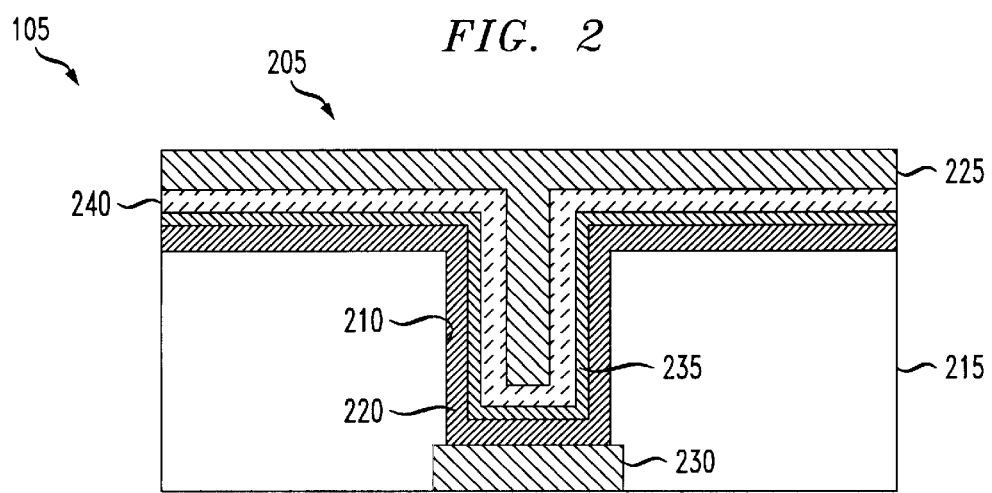
FIG. 2 illustrates another embodiment of the present invention wherein the semiconductor device is a capacitor that can be incorporated into an integrated circuit.

Turning now to FIG. 2, there is illustrated another embodiment of the present invention wherein the semiconductor device 105 is a capacitor 205 that can be incorporated into an integrated circuit. The capacitor 205 may be formed with the integrated circuit in a number of ways. However, in the embodiment illustrated in FIG. 2, the capacitor 205 is formed within an opening 210 that is formed in a dielectric layer 215, such as an interlevel silicon dioxide. The dielectric layer 215 is conventionally formed, and the capacitor 205 is typically formed at metal level 1 or higher within the integrated circuit. However, other embodiments may have the capacitor 205 formed at the transistor level.

In an advantageous embodiment, the capacitor 205 includes a first layer 220. Preferably, the first layer 220 is TiN. The capacitor 205 includes a second layer 225 that is deposited by conventional deposition processes. In the embodiment illustrated in FIG. 2, a lower interconnect or contact plug structure 230, to which the capacitor 205 is connected, functions as a contact for the capacitor 205. A metal barrier layer 235, which is susceptible to oxidation by oxygen, is located on the first layer 220. As with previously discussed embodiments, the metal barrier layer 235 is preferably a metal that can be easily oxidized, such as aluminum, zirconium, hafnium, or yttrium and similar metals. The metal barrier layer 235 also can be deposited by conventional deposition processes, such as chemical or physical vapor deposition, to any predetermined thickness. However, in an advantageous embodiment, the metal barrier layer 235 is deposited to a thickness ranging from about 0.2 nm to about 4 nm.

A high K capacitor dielectric layer 240, which functions as the capacitor dielectric and that contains oxygen, is located on the metal barrier layer 235. As with previously discussed embodiments, a preferred high K capacitor dielectric layer 240 is $Ta_2O_5$. The high K dielectric layer 240 may be deposited by conventional deposition processes and thickness may vary greatly. In preferred embodiments, the thickness of the high K dielectric layer 240 ranges from about 2 nm to about 10 nm, and in the embodiment illustrated in FIG. 2, the thickness is preferably about 10 nm. While the illustrated embodiment shows the high K capacitor dielectric layer 240 located directly on the metal barrier layer 235, other embodiment may, of course include intervening layers of materials such that the high K capacitor dielectric layer 240 is located over the metal barrier layer 235. The metal barrier layer 235, may in a preferred embodiment, serve as an oxygen diffusion barrier layer between the first layer 220 and the high K dielectric layer 240. In FIG. 2, the high K dielectric layer 240 functions as the capacitor dielectric for the capacitor 205.

Thus, FIG. 2 shows a capacitor device 205 that provides a capacitance for an integrated circuit into which it can be incorporated. The capacitance is formed by the presences of a first electrode 225, a capacitor dielectric, which is comprised of the high K dielectric layer 240, and a second electrode, which is a lower interconnect or contact plug 230. In an exemplary embodiment, the high K dielectric layer 240 may comprise a similar material as the gate oxide. The metal barrier layer 235 inhibits the depletion of oxygen from the high K dielectric layer 240. All the layers that form the semiconductor device 105 can be formed by conventional semiconductor fabrication processes.

In the illustrated embodiment of FIG. 2, the first layer 220 typically comprises TiN. Titanium nitride can cause the oxygen within the high K dielectric layer 240 to be depleted such that it inhibits the high K dielectric layer 240 from functioning properly as a capacitor dielectric. As discussed above, this can cause the capacitor to function improperly or fail all together. This is particularly the case where the high K dielectric layer 240 is $Ta_2O_5$. Titanium nitride readily depletes or steals oxygen from the $Ta_2O_5$. Because the metal barrier layer 235 is easily oxidized, it is believed that it traps the oxygen at the metal barrier layer 235 and high K dielectric layer 240 interface and prevents the oxygen from further being depleted from the high K dielectric layer 240. This maintains the capacitance integrity of the high K dielectric layer 240 and allows the semiconductor device 105 to provide the desired degree of capacitance. While it has been discussed that the first layer 220 typically comprises titanium nitride, it should be noted that other materials, including tantalum nitride, tungsten nitride or another similar material, are within the scope of the present invention.

Figure 3:
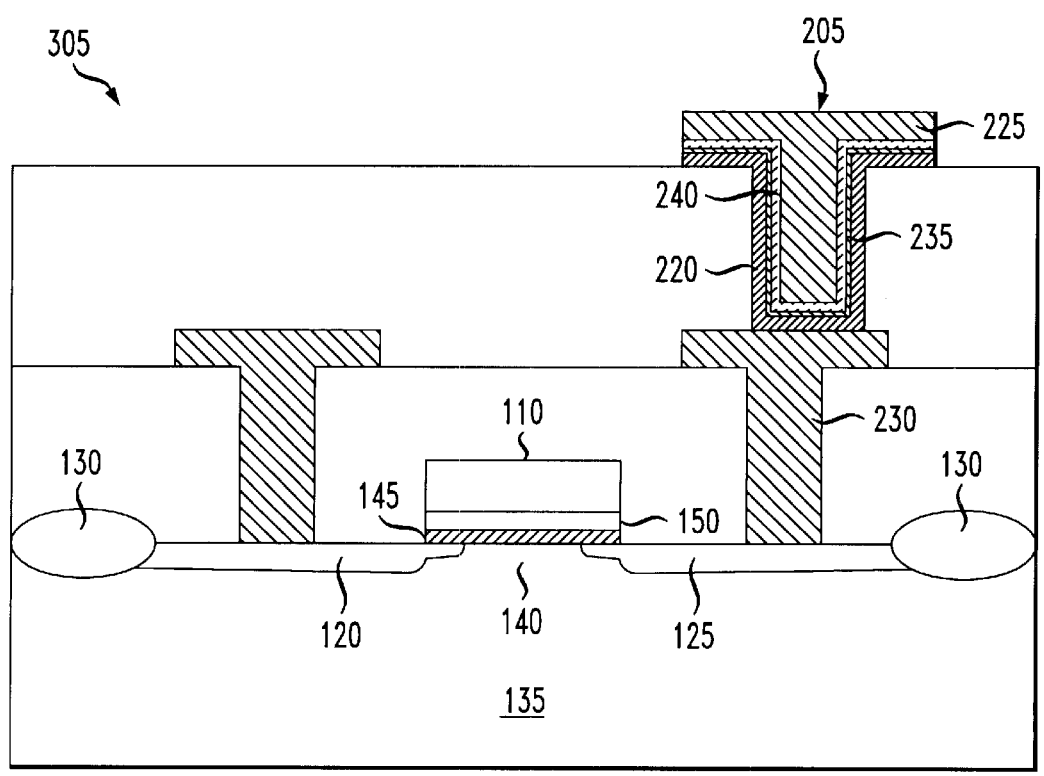
FIG. 3 illustrates a partial sectional view of an integrated circuit wherein the unique capacitance devices discussed above with respect to FIGS. 1 and 2 may be incorporated.

Turning now to FIG. 3, there is illustrated a partial sectional view of an integrated circuit 305 wherein the unique capacitance devices discussed above with respect to FIGS. 1 and 2 may be incorporated. As seen from FIG. 3, the capacitance devices may easily be incorporated into existing integrated circuit technologies. Thus, the desired degree of capacitance may be maintained without the advantages associated with the above-discussed prior art devices.

Although the present invention has been described in detail, those skilled in the art should understand that they can make various changes, substitutions and alterations herein without departing from the spirit and scope of the invention in its broadest form.

What is claimed is:

1. A method of forming an integrated circuit on a semiconductor wafer, comprising:
   forming a doped transistor tub region within a substrate of the semiconductor wafer;
   forming an integrated circuit over the doped transistor tub region, and
   forming a device within the integrated circuit for providing a capacitance to the integrated circuit, including:
   forming a first layer over the substrate;
   forming a metal barrier layer over the first layer, the metal barrier layer susceptible to oxidation by oxygen;
   forming a high K capacitor dielectric layer containing oxygen over the metal barrier layer; and
   forming a second layer over the high K capacitor dielectric layer.

2. The method as recited in claim 1 wherein forming the device includes forming the device within an opening formed in a dielectric layer of the integrated circuit overlaying a transistor level of the integrated circuit.

3. The method as recited in claim 1 wherein forming a first layer includes forming a titanium nitride layer.

4. The method as recited in claim 1 wherein forming a first layer includes forming a tantalum nitride layer or tungsten nitride layer.

5. The method as recited in claim 1 wherein forming a high K capacitor dielectric layer includes forming a high K capacitor having a dielectric constant greater than a dielectric constant of silicon dioxide.

6. The method as recited in claim 1 wherein forming a metal barrier layer includes forming the metal barrier layer with aluminum.

7. The method as recited in claim 1 wherein forming a metal barrier layer includes forming a metal barrier layer having a thickness ranging from about 0.2 nm to about 4 nm.

8. The method as recited in claim 1 wherein forming a high K capacitor dielectric layer includes forming the high K capacitor with a tantalum pentoxide layer.

9. The method as recited in claim 1 wherein forming the semiconductor device includes forming a transistor gate over the doped transistor tub region, wherein the first layer is a portion of the doped tub region, the transistor gate is the second layer, and the high K capacitor dielectric layer is a gate oxide layer for the transistor gate.

10. The method as recited in claim 1 wherein the metal barrier layer contains aluminum.

11. The method as recited in claim 1 wherein the metal barrier layer contains a metal selected from the group consisting of zirconium, hafnium, and yttrium.

12. The method as recited in claim 1 wherein the gate oxide layer contains tantalum pentoxide layer.

13. The method as recited in claim 1 wherein the gate oxide layer has a thickness ranging from about 2 nm to about 7 nm.

* * * * *